United States Patent [19]
Hirabayashi et al.

[11] Patent Number: 6,046,110
[45] Date of Patent: Apr. 4, 2000

[54] COPPER-BASED METAL POLISHING SOLUTION AND METHOD FOR MANUFACTURING A SEMICONDUCTOR DEVICE

[75] Inventors: Hideaki Hirabayashi, Tokyo; Naoaki Sakurai, Yokohama, both of Japan

[73] Assignee: Kabushiki Kaisha Toshiba, Kawasaki, Japan

[21] Appl. No.: 08/659,009

[22] Filed: Jun. 4, 1996

[30] Foreign Application Priority Data

Jun. 8, 1995 [JP] Japan ................................. 7-142045

[51] Int. Cl.[7] ...................................... B44C 1/22
[52] U.S. Cl. .......................... 438/693; 438/691; 438/692; 216/88; 216/89; 252/79.1
[58] Field of Search .................... 438/693, 692, 438/691; 216/38, 88, 89; 252/79.1

[56] References Cited

U.S. PATENT DOCUMENTS

| | | | |
|---|---|---|---|
| 4,915,710 | 4/1990 | Miyazaki et al. | 51/309 |
| 4,954,142 | 9/1990 | Carr et al. | 51/309 |
| 4,956,313 | 9/1990 | Cote et al. | 437/203 |
| 5,340,370 | 8/1994 | Cadien et al. | 51/308 |
| 5,354,490 | 10/1994 | Yu et al. | 525/79.1 |
| 5,366,542 | 11/1994 | Yamada et al. | 106/3 |
| 5,527,423 | 6/1996 | Neville et al. | 156/636.1 |
| 5,575,885 | 11/1996 | Hirabayashi et al. | 156/626.1 |

FOREIGN PATENT DOCUMENTS

| | | |
|---|---|---|
| 401147 | 12/1990 | European Pat. Off. . |
| 659858 | 6/1995 | European Pat. Off. . |
| 7-233485 | 9/1995 | Japan . |

OTHER PUBLICATIONS

Patent Abstracts of Japan, Abstract of JP 58–064385.
Patent Abstracts of Japan, Abstract of JP 61–056285.
Patent Abstracts of Japan, Abstract of JP 61–056286.
Stumm and Morgan, "Aquatic Chemistry, An Introduction Emphasizing Chemical Equilibria in Natural Waters," Chapter 6, pp. 323–5, 1981.
Printout of REGISTRY database entry number 101049–45–0, 1997.

*Primary Examiner*—Marion E. McCamish
*Assistant Examiner*—Cheryl Juska
*Attorney, Agent, or Firm*—Oblon, Spivak, McClelland, Maier & Neustadt, P.C.

[57] ABSTRACT

A copper-based metal polishing solution comprises a water-soluble organic acid capable of reaction with copper to form a copper complex compound which is unlikely to be dissolved in water and has a mechanical strength lower than that of copper. The polishing solution also contains polishing abrasive grains and water. The polishing solution of the particular composition does not dissolve at all copper or a copper alloy when a copper or copper alloy film is immersed in the polishing solution, and permits polishing the copper or copper alloy film at a practical rate in the polishing step.

33 Claims, 9 Drawing Sheets

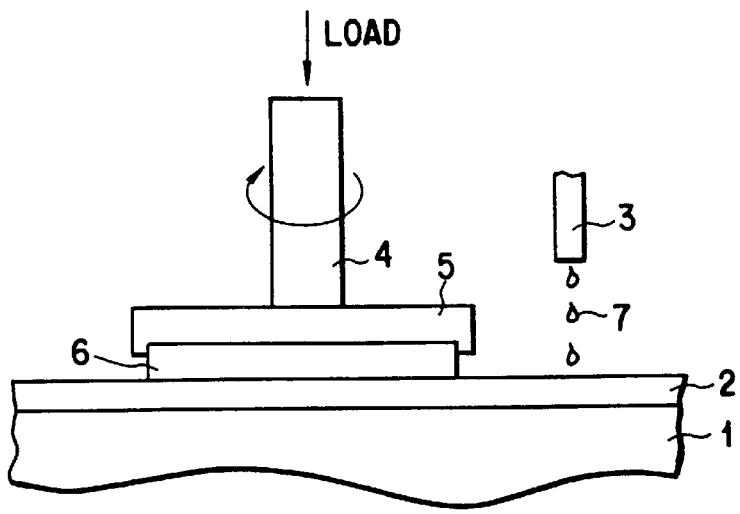
F I G. 1
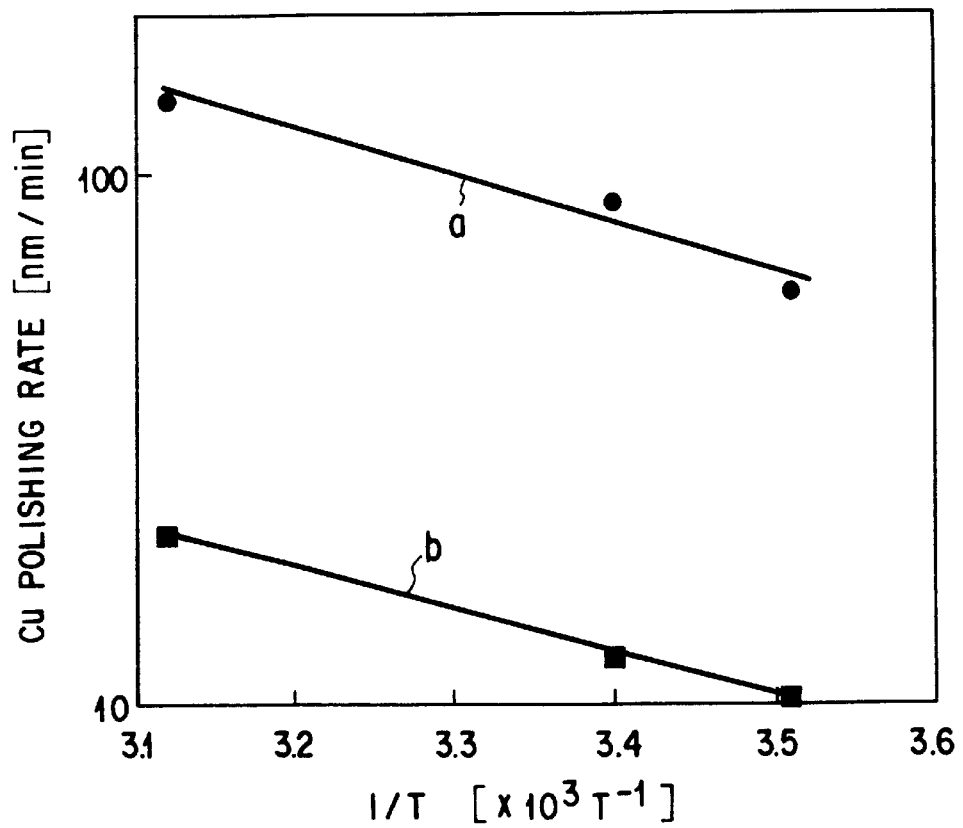
F I G. 2

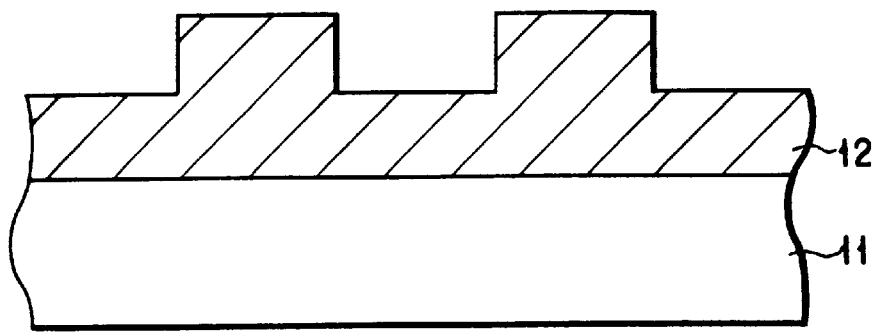
F I G. 5A
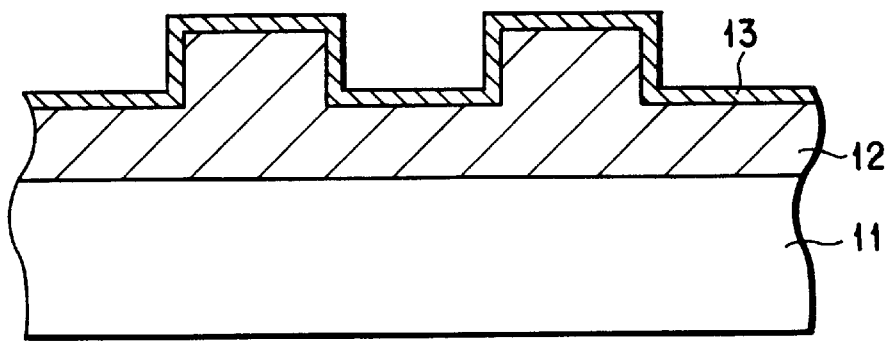
F I G. 5B
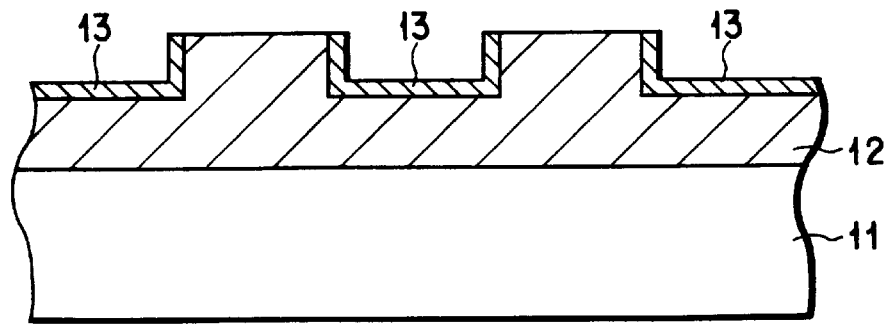
F I G. 5C

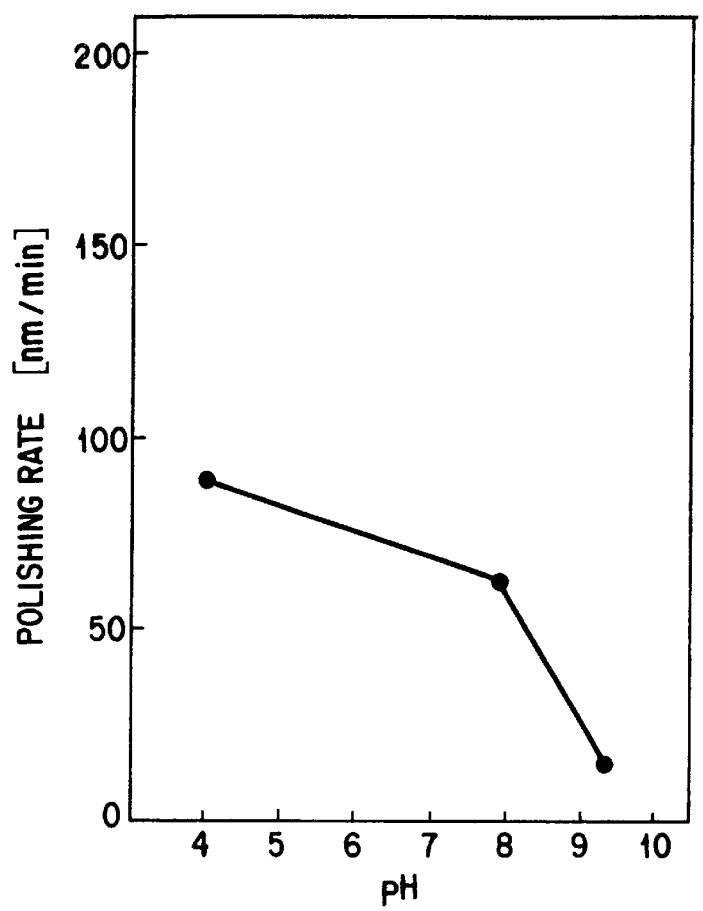
F I G. 6
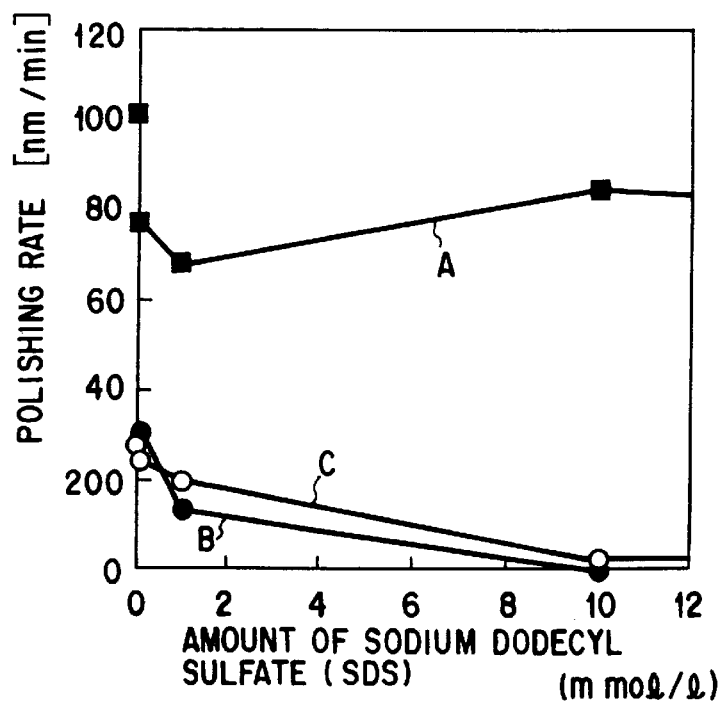
F I G. 7

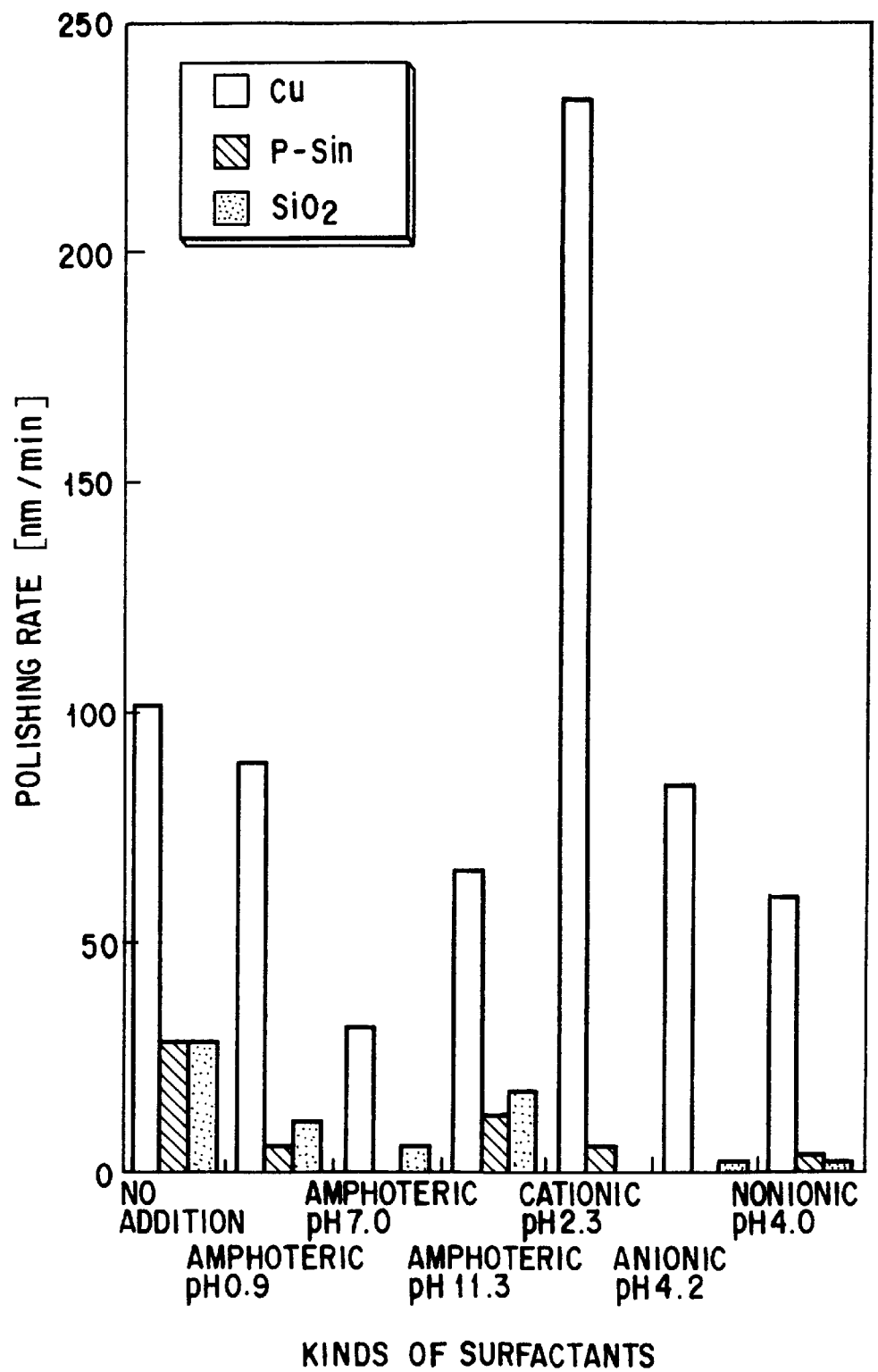
F I G. 8

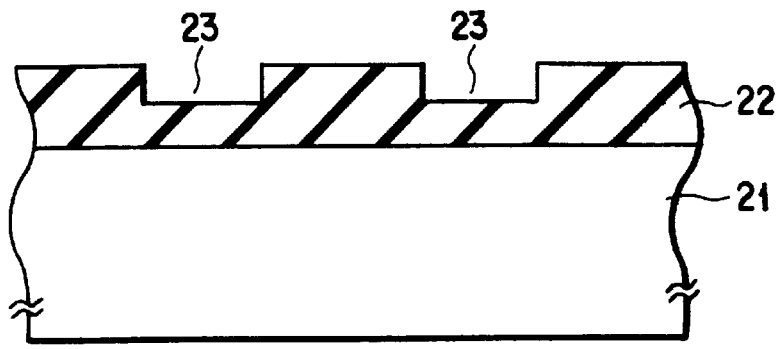
F I G. 9A
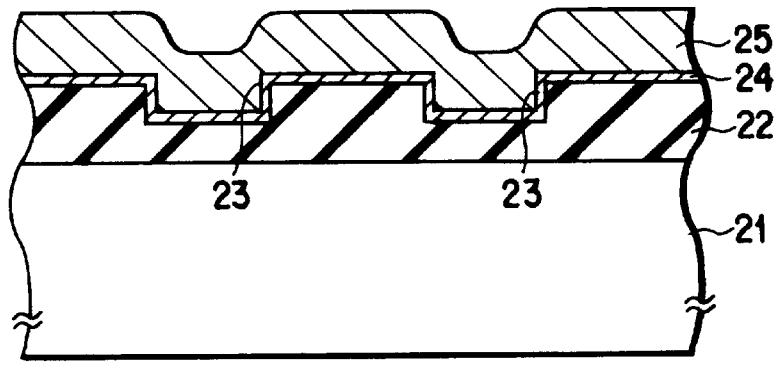
F I G. 9B
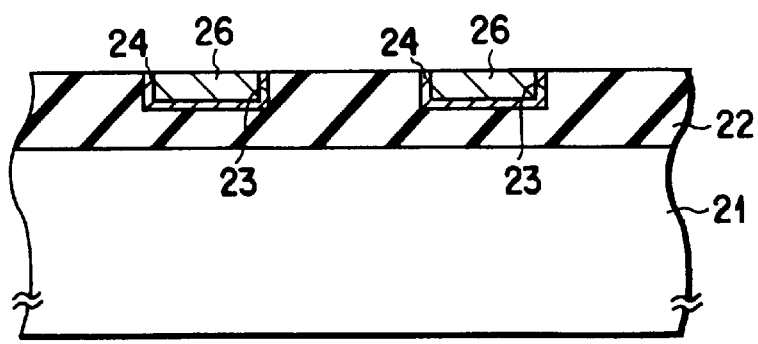
F I G. 9C

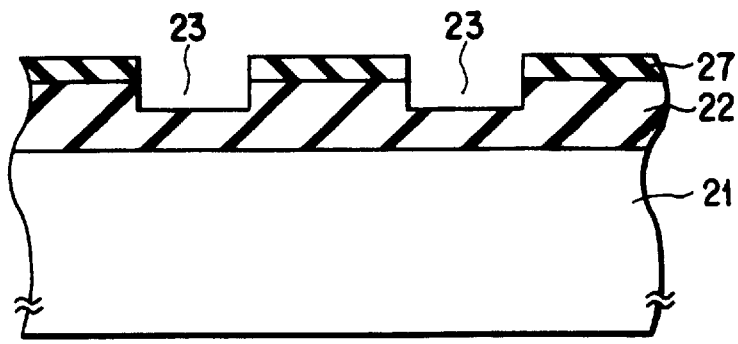
F I G. 10A
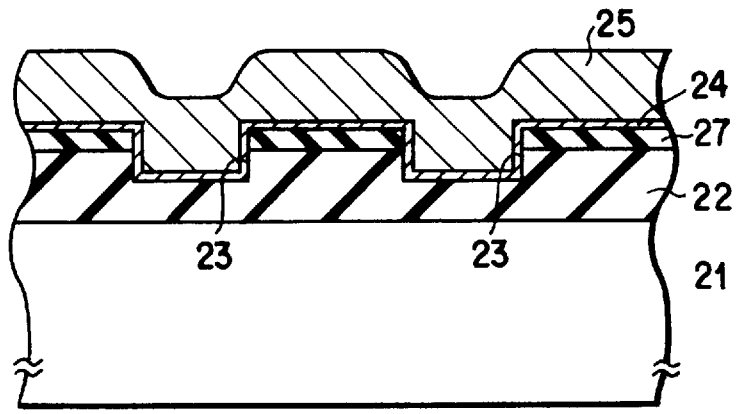
F I G. 10B
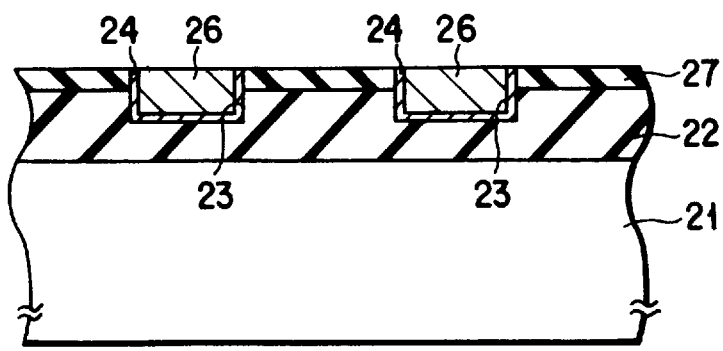
F I G. 10C

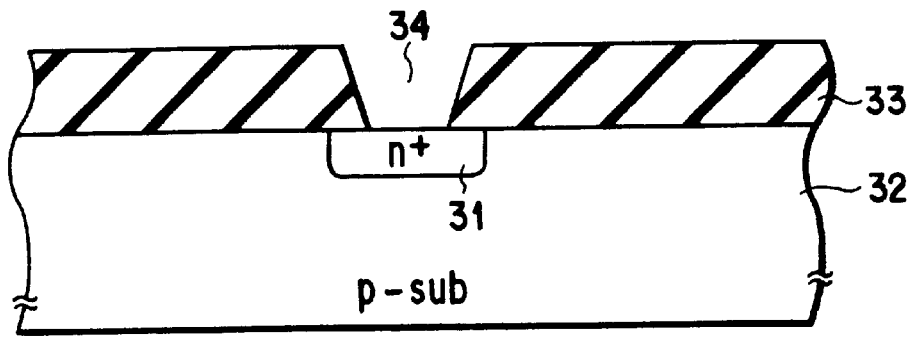
F I G. 11A
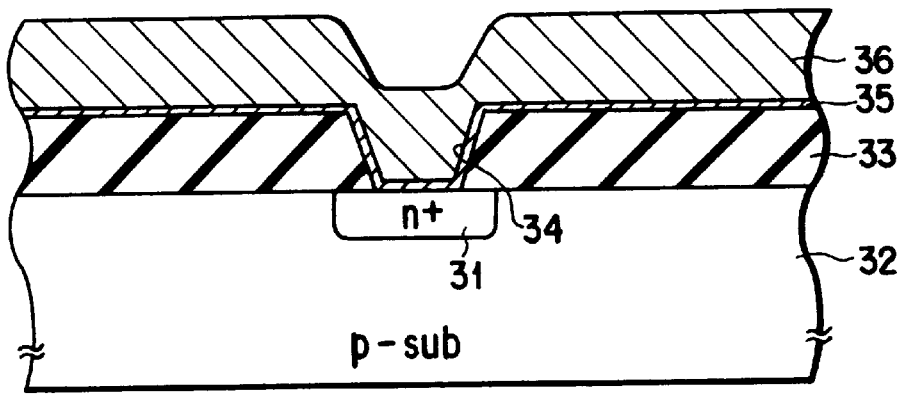
F I G. 11B
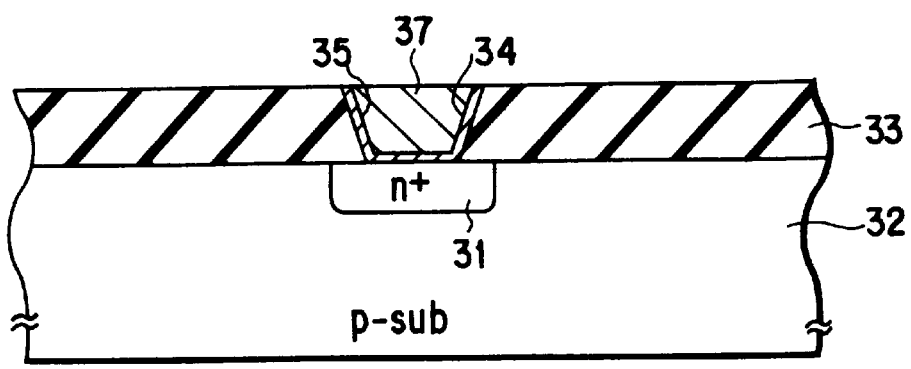
F I G. 11C

COPPER-BASED METAL POLISHING SOLUTION AND METHOD FOR MANUFACTURING A SEMICONDUCTOR DEVICE

BACKGROUND OF THE INVENTION

1. Field of the Invention

The present invention relates to a copper-based metal polishing solution and a method for manufacturing a semiconductor device.

2. Description of the Related Art

Formation of a wiring layer is included in the process of manufacturing a semiconductor device, and an etch-back technique is employed for eliminating stepped portions from a surface of the wiring layer. The etch-back technique comprises the steps of forming grooves conforming with a pattern of the wiring layer in an insulating film covering a substrate of a semiconductor substrate, depositing a copper film on the insulating film including the trenches, polishing the copper film with a polishing solution, and selectively allowing the copper film to remain within the trenches to form a buried wiring layer.

It was customary in the past to use a polishing solution prepared by dispersing polishing abrasive grains such as a colloidal silica in pure water. In the conventional technique, the polishing solution is supplied into a polishing pad included in a polishing apparatus, and the copper film formed on the substrate surface is polished, with a predetermined load applied to the polishing pad. In the conventional technique, however, a mechanical polishing, which involves the polishing abrasive grains and the polishing pad, is simply applied to the copper film, with the result that the polishing rate was as low as only 10 nm/min.

Other types of polishing solutions for a copper film or a copper alloy film are disclosed in, for example, "J. Electrochem. Soc., Vol. 138, No. 11, 3460 (1991)", "VMIC Conference, ISMIC-101/92/0156 (1992)" and "VMIC Conference, ISMIC-102/93/0205 (1993)". To be more specific, disclosed in these publications are polishing solutions each consisting of a slurry of an amine-based colloidal silica or a slurry containing $K_3Fe(CN)_6$, $K_4(CN)_6$, or $Co(NO_3)_2$. However, the polishing solution disclosed in any of these publications gives rise to the difficulty that there is no difference in the etching rate of the copper film between the immersing step and the polishing step. As a result, the copper wiring layer within the trench is further etched with the polishing solution when the wiring layer is brought into contact with the polishing solution after the etch-back step. It follows that the upper surface of the copper wiring layer within the trench is positioned lower than the upper surface of the insulating film. In other words, it is difficult to form the wiring layer flush with the insulating film, leading to an impaired surface smoothness. What should also be noted is that the copper wiring layer buried in this fashion in the insulating film exhibits a resistivity higher than that of the copper wiring layer buried in the insulating film such that the upper surface of the wiring layer is flush with the upper surface of the insulating film.

Japanese Patent Disclosure (Kokai) No. 7-233485 discloses an additional copper-based metal polishing solution prepared by adding at least one kind of an organic acid selected from the group consisting of aminoacetic acid and amidosulfuric acid, and an oxidizing agent to water. Where elemental copper or a copper alloy is immersed in the copper-based metal polishing solution disclosed in this publication, the etching rate of the copper or copper alloy is very low. However, where the copper or copper alloy is subjected to a polishing treatment with the particular polishing solution, the etching rate of the copper or copper alloy is several to scores of times as high as that in the case of the immersion in the polishing solution. To be more specific, if aminoacetic acid included in the polishing solution disclosed in the above-noted publication reacts with hydrated copper, a complex compound soluble in water is formed, as shown below:

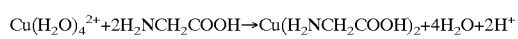

It should be noted that copper does not react with a mixture of aminoacetic acid and water. The reaction given above proceeds in a direction denoted by the arrow, if an oxidizing agent, e.g., hydrogen peroxide, is added to the reaction system, resulting in an etching of copper. If, for example, a copper film is immersed in the polishing solution, an oxide film is formed on the surface of the copper film so as to suppress the etching (dissolving) of the copper film. On the other hand, if the copper film is polished with a polishing pad containing the polishing solution, the oxide film formed on the film surface is mechanically removed by the polishing pad so as to expose the pure copper to the surface. It follows that the copper film is rapidly polished chemically by the functions of the aminoacetic acid and hydrogen peroxide contained in the polishing solution. It should be noted in this connection that the copper or copper alloy film tends to be dissolved in the polishing solution to some extent during a short period immediately after the polishing treatment and before formation of an oxide film on the film surface.

The prior art exemplified above, i.e., Japanese Patent Disclosure No. 7-233485, also discloses a method for manufacturing a semiconductor device in which a buried wiring layer made of copper or a copper alloy is formed by an etch-back technique using the copper-based metal polishing solution described above.

SUMMARY OF THE INVENTION

An object of the present invention is to provide a copper-based metal polishing solution which does not dissolve at all a copper or copper alloy film immersed therein and which permits the copper or copper alloy film to be polished at a practical rate in the polishing step.

Another object is to provide a method for manufacturing a semiconductor device, in which at least one member selected from the group consisting of a trench and an opening is formed in an insulating film on a semiconductor substrate, a wiring material selected from the group consisting of elemental copper and a copper alloy deposited on the insulating film can be etched back within short time period to form a buried wiring layer whose surface is level with the surface of the insulating film.

According to a first aspect of the present invention, there is provided a copper-based metal polishing solution, comprising a water-soluble organic acid capable of reaction with copper to form a copper complex compound which is unlikely to be dissolved in water and has a mechanical strength lower than that of copper, polishing abrasive grains and water.

According to a second aspect of the present invention, there is provided a method for manufacturing a semiconductor device, comprising the steps of:

forming at least one member selected from the group consisting of a trench and an opening, the groove and opening conforming in shape with a wiring layer, in an insulating film formed on a semiconductor substrate;

depositing a wiring material selected from the group consisting of elemental copper and a copper alloy on the insulating film having at least one of the trench and opening formed therein; and polishing the deposited wiring material film until a surface of the insulating film is exposed by using a polishing solution comprising a water-soluble organic acid capable of reaction with copper to form a copper complex compound which is unlikely to be dissolved in water and has a mechanical strength lower than that of copper, polishing abrasive grains and water, thereby forming a buried wiring layer in the insulating film such that surfaces of the wiring layer and the insulating film are level with each other.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 1 is a cross sectional view schematically showing the construction of a polishing apparatus used in the polishing step included in the method of the present invention;

FIG. 2 is a graph showing the relationship between the polishing rate and the temperature of the polishing solution, covering the cases where a copper film formed on a substrate was subjected to a polishing treatment using a polishing solution of the present invention or a conventional polishing solution containing polishing abrasive grains;

FIGS. 5A to 5C are cross sectional views collectively showing how a copper film having projections and recesses on the surface will be changed when subjected to a polishing treatment with a polishing apparatus, using a polishing solution consisting of 2-quinoline carboxylic acid, hydrogen peroxide, polishing abrasive grains and water;

FIG. 6 is a graph showing the relationship between the polishing rate of a copper film and the pH value of a polishing solution;

FIG. 7 is a graph showing the relationship between the polishing rate of a copper film, a P-SiN film, i.e., a silicon nitride film formed by plasma CVD, and a $SiO_2$ film and an amount of a surfactant (sodium dodecyl sulfate) added to the polishing solution;

FIG. 8 is a graph showing the relationship between the polishing rate of a copper film, a P-SiN film and a $SiO_2$ film and the kinds of surfactants added to the polishing solution;

FIGS. 9A to 9C are cross sectional views collectively showing a method of manufacturing a semiconductor device according to a first embodiment (Example 1) of the present invention;

FIGS. 10A to 10C are cross sectional views collectively showing a method of manufacturing a semiconductor device according to a second embodiment (Example 5) of the present invention; and FIGS. 11A to 11F are cross sectional views collectively showing a method of manufacturing a semiconductor device according to a third embodiment (Example 6) of the present invention.

DETAILED DESCRIPTION OF THE PREFERRED EMBODIMENTS

Figure 3:
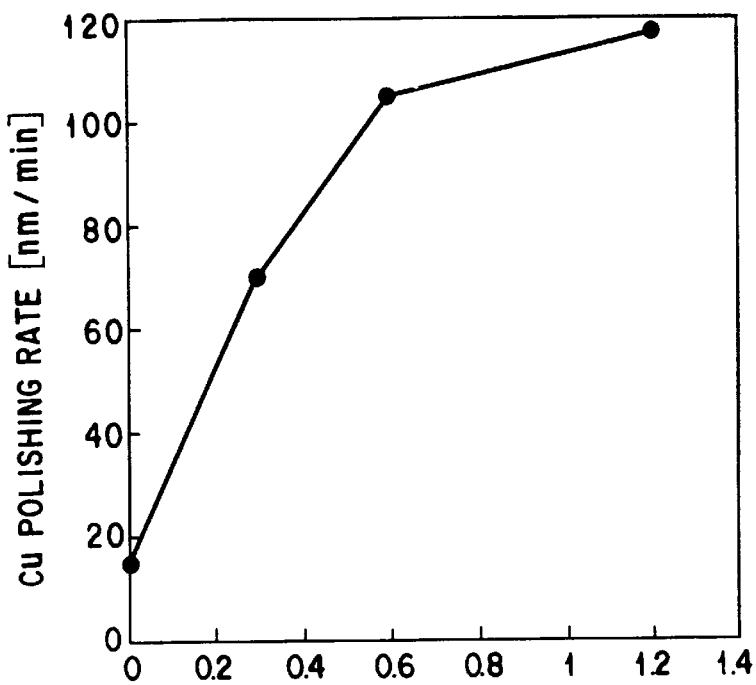
FIG. 3 is a graph showing the relationship between the polishing rate of a copper film and the 2-quinoline carboxylic acid content of a polishing solution consisting of 2-quinoline carboxylic acid, hydrogen peroxide, polishing abrasive grains and water.

Let us describe in detail a copper-based metal polishing solution of the present invention.

Specifically, the copper-based metal polishing solution of the present invention comprises a water-soluble organic acid capable of reaction with copper to form a copper complex compound which is unlikely to be dissolved in water and has a mechanical strength lower than that of copper, polishing abrasive grains and water.

The organic acid used in the present invention includes, for example, 2-quinoline carboxylic acid (quinaldinic acid), 2-pyridine carboxylic acid, 2,6-pyridine carboxylic acid, and quinones. It is desirable for the polishing solution to contain at least 0.1% by weight of the particular organic acid. If the organic acid content of the polishing solution is lower than 0.1% by weight, it is difficult to form in a sufficiently large amount a copper complex compound which is mechanically weaker than the elemental copper on the surface of a copper film or a copper alloy film, making it difficult to increase sufficiently the polishing rate of the copper or copper alloy film in the polishing step. Preferably, the organic acid content of the polishing solution should fall within a range of between 0.3 and 1.2% by weight.

The polishing abrasive grains contained in the polishing solution of the present invention are formed of at least one material selected from the group consisting of silica, zirconia, cerium oxide and alumina. Particularly, it is desirable to use alumina grains having a hardness adapted for the polishing as a base material of the polishing abrasive grains. To be more specific, it is desirable for the polishing abrasive grains to consist of alumina grains singly or of a mixture of alumina grains and silica grains such as colloidal silica. Also, the polishing abrasive grains should desirably be spherical and have an average diameter of 0.02 to 0.1 μm. Where a copper film or a copper alloy film is subjected to a polishing treatment with a polishing solution containing polishing abrasive grains having such an average grain diameter, it is possible to suppress damage done to the surface of the copper or copper alloy film. It is particularly desirable to use γ-alumina for forming spherical polishing abrasive grains because spherical grains can be prepared without difficulty in the case of using γ-alumina.

It is desirable for the polishing solution of the present invention to contain 1 to 20% by weight of the polishing abrasive grains. If the content of the polishing abrasive grains is lower than 1% by weight, it is difficult to obtain sufficiently the effect produced by the polishing abrasive grains. On the other hand, the polishing abrasive grains added in an amount exceeding 20% by weight cause the polishing solution to be unduly viscous, making it difficult to handle smoothly the polishing solution. Preferably, the content of the polishing abrasive grains should fall within a range of between 2 and 10% by weight.

The polishing solution of the present invention may also contain a promoter for forming a copper complex compound including, for example, oxidizing agents such as hydrogen peroxide ($H_2O_2$), and sodium hypochlorite (NaClO). It is desirable for the polishing solution of the present invention to contain the oxidizing agent in an amount at least 10 times as much by weight as that of the organic acid. Where the amount of the oxidizing agent is less than 10 times as much by weight as that of the organic acid, it is impossible to promote sufficiently formation of a copper complex compound on the surface of the copper or copper alloy film. The amount of the oxidizing agent should preferably be at least 30 times as much, and more preferably 50 times as much, by weight as that of the organic agent.

The polishing solution of the present invention may also contain a pH-adjusting agent such as an alkalizing agent including, for example, potassium hydroxide or choline.

The polishing solution of the present invention may further contain nonionic, amphoteric, anionic, and cationic surfactants. The nonionic surfactants used in the present invention include, for example, polyethylene glycol phenyl ether and ethylene glycol fatty acid ester. The amphoteric surfactants include, for example, imidazolibetain. The anionic surfactants include, for example, sodium dodecylsulfate. Further, the cationic surfactants include, for example, stearin trimethyl ammonium chloride. It is desirable to use these surfactants in the form of a mixture of at least two compounds. The polishing solution of the present invention further containing surfactants permits improving the selectivity of polishing between a copper or copper alloy film and an insulating film such as a SiN film or a $Si_2O$ film, as described in detail herein later.

It is desirable to use the surfactant in an amount of 1 mol per liter of the polishing solution. Where the amount of the surfactant is less than 1 mol per liter of the polishing solution, it is difficult to improve the selectivity of polishing between the copper or copper alloy film and the insulating film such as a $SiO_2$ film in the polishing step. More preferably, the amount of the surfactant should fall within the range of between 10 and 100 mols per liter of the polishing solution.

FIG. 1 shows a polishing apparatus used for polishing a copper or copper-alloy film formed on a substrate by using a copper-based metal polishing solution of the present invention. As shown in the drawing, a turntable 1 is covered with a polishing pad 2 made of, for example, a cloth. A pipe 3 for supplying a polishing solution is arranged above the polishing pad 2. Further, a substrate holder 5 having a supporting shaft 4 mounted to the upper surface thereof is also arranged above the polishing pad 2. The substrate holder 5 is rotatable and movable in a vertical direction. A substrate 6 is held by the holder 5 such that the polishing surface, e.g., a copper film, of the substrate 6 is in contact with the polishing pad 2. Under this condition, a polishing solution 7 of the composition described previously is supplied through the pipe 3 onto the polishing pad 2. In this step, a predetermined load is applied to the substrate 6 toward the polishing pad 2 by using the supporting shaft 4 of the polishing apparatus. Further, the holder 5 and the turntable 1 are rotated in opposite directions so as to polish the copper film formed on the substrate.

To reiterate, the copper-based metal polishing solution of the present invention comprises a water-soluble organic acid capable of reaction with copper to form a copper complex compound which is unlikely to be dissolved in water and has a mechanical strength lower than that of copper, polishing abrasive grains and water. As a result, the copper or copper alloy film is not dissolved at all when the film is immersed in the polishing solution, making it possible to polish the copper or copper alloy film at a practical polishing rate. Incidentally, the term "practical polishing rate" referred to above denotes a polishing rate at least 3 times as high as that in the case of using a conventional polishing solution containing polishing abrasive grains alone.

To be more specific, the organic acid contained in the polishing solution of the present invention, e.g., 2-quinoline carboxylic acid, reacts with a copper hydrate (copper ion) to form a copper complex compound which is unlikely to be dissolved in water, as shown by the reaction formula given below:

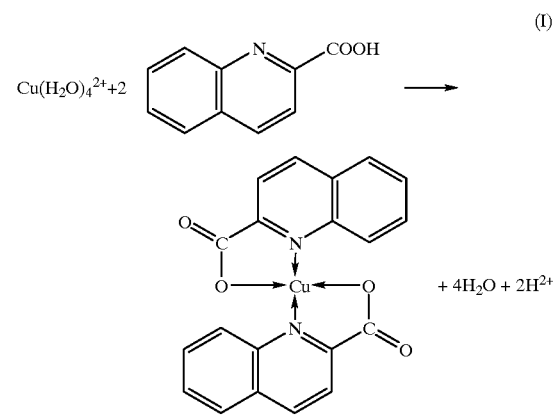

The copper complex compound formed on the surface of the copper or copper alloy film by the reaction given above is not dissolved in water, and has a mechanical strength lower than that of the copper or copper alloy. It follows that the copper complex compound can be removed easily by the polishing treatment.

Where the polishing solution further contains a promoter such as an oxidizing agent for forming the copper complex compound, formation of the copper complex compound by the reaction given above is promoted, with the result that the copper or copper alloy film can be polished at a polishing rate at least 5 times as high as that in the case of using a conventional polishing solution containing the polishing abrasive grains alone.

FIG. 2 is a graph showing the relationship between the polishing rate and the temperature of the polishing solution, covering the cases where a copper film formed on a substrate was subjected to a polishing treatment using a polishing solution of the present invention or a conventional polishing solution containing polishing abrasive grains. The polishing solution of the present invention contained 0.3% by weight of an organic acid, e.g., 2-quinoline carboxylic acid, 16.7% by weight of a promoter for forming a copper complex compound, e.g., hydrogen peroxide, 4.0% by weight of colloidal silica, and water. Line a in FIG. 2 covers the use of the polishing solution of the present invention, with line b covering the use of the conventional polishing solution. The polishing apparatus shown in FIG. 1 was used for performing the polishing treatment. Specifically, a substrate having a copper film formed on a surface was held by the substrate holder 5 such that the copper film was in contact with the polishing pad 2, i.e., SUBA 800, which is a trade name of a polishing pad manufactured by Rhodel Nitter Inc. Under this condition, a load of 300 g/cm$^2$ was applied to the substrate toward the polishing pad 2 via the supporting shaft 4. Further, the polishing solution was supplied through the pipe 3 onto the polishing pad 2 at a rate of 12.5 ml/min while rotating the turntable 1 and the holder 5 in opposite directions at a speed of 100 rpm so as to apply a polishing treatment to the copper film formed on the surface of the substrate. As apparent from FIG. 2, the polishing rate of the copper film in the case of using the polishing solution of the present invention (line a) was found to be about 6 times as high as that in the case of using the conventional polishing solution containing polishing abrasive grains alone (line b).

FIG. 3 is a graph showing the relationship between the polishing rate of a copper film and the 2-quinoline carboxylic acid content of a polishing solution consisting of varied amounts of 2-quinoline carboxylic acid, 16.7% by weight of hydrogen peroxide, polishing abrasive grains consisting of 1.3% by weight of γ-alumina grains and 4.0% by weight of colloidal silica grains, and water. The polishing treatment was performed as described above in conjunction with FIG. 2 using the polishing apparatus shown in FIG. 1. As apparent from FIG. 3, the polishing rate of the copper film is increased with increase in the 2-quinoline carboxylic acid content of the polishing solution.

Figure 4:
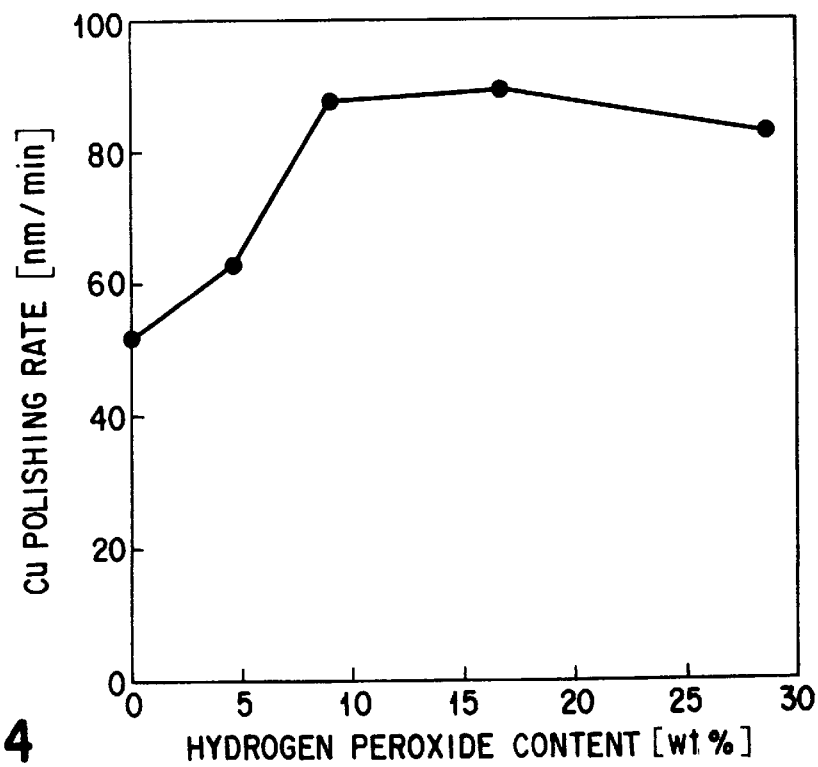
FIG. 4 is a graph showing the relationship between the polishing rate of a copper film and the hydrogen peroxide content of a polishing solution consisting of 2-quinoline carboxylic acid, hydrogen peroxide, polishing abrasive grains and water.

FIG. 4 is a graph showing the relationship between the polishing rate of a copper film formed on a substrate and the hydrogen peroxide content of a polishing solution consisting of 0.3% by weight of 2-quinoline carboxylic acid, varied amount of hydrogen peroxide, polishing abrasive grains formed of a mixture of 1.3% by weight of γ-lumina grains and 4.0% by weight of colloidal silica grains, and water. The polishing treatment was performed as already described in conjunction with FIG. 2 by using the polishing apparatus shown in FIG. 1. As apparent from FIG. 4, the polishing rate of the copper film was only about 51 nm/min in the case where hydrogen peroxide was not contained at all in the polishing solution. It is also seen that the polishing rate was increased with increase in the hydrogen peroxide content of the polishing solution, reaching a polishing rate of about 90 nm/min where the hydrogen peroxide content of the polishing solution exceeded 9% by weight. It is considered reasonable to understand that the hydrogen peroxide contained in the polishing solution serves to promote formation of the copper complex compound such that the copper or copper alloy film exposed to the outside in the mechanical polishing process performed by the polishing pad and the polishing abrasive grains contained in the polishing solution is allowed to promptly form the brittle copper complex compound in accordance with the reaction formula given previously.

As a matter of fact, a copper film 12 having projections and recesses on the surface was formed on a surface of a substrate 11, as shown in FIG. 5A and, then, immersed in the polishing solution having a high polishing rate, which is shown in FIG. 4, for 3 minutes. To reiterate, the polishing solution contained 0.3% by weight of 2-quinoline carboxylic acid, 1.3% by weight of γ-alumina grains, 4.0% by weight of colloidal silica grains, and 16.7% by weight of hydrogen peroxide. As a result, a copper complex compound layer 13 was formed on the surface of the copper film 12, as shown in FIG. 5B. After the immersion in the polishing solution, the surface of the copper film 12 was analyzed by XPS (X-ray photoelectron spectroscopy). A large amount of carbon was detected on the copper film surface, though the copper amount detected was very small. Further, the thickness of the copper complex compound layer was found to be about 20 nm when measured by AES (Auger electron spectroscopy).

The copper film 12 having the copper complex compound layer 13 formed thereon as shown in FIG. 5B was polished by the polishing pad included in the polishing apparatus shown in FIG. 1, using a polishing solution of the composition described above. As a result, the copper complex compound layer 13 formed on the projected portion of the copper film 12 was mechanically polished without difficulty by the polishing pad so as to expose the pure copper film 12 to the outside, as shown in FIG. 5C. The surface of the copper film immediately after the polishing was analyzed by XPS (X-ray photoelectron spectroscopy), with the result that copper alone, which was scarcely oxidized, was detected. It is considered reasonable to understand that, in the process of the polishing treatment, the polishing of the copper film surface proceeds such that a copper complex compound layer having a mechanical strength lower than that of the copper film is formed on the surface of the copper film and the copper complex compound layer thus formed is mechanically removed by the polishing pad.

Incidentally, the polishing solution of the present invention consisting of 2-quinoline carboxylic acid, polishing abrasive grains and water exhibits a polishing rate at least 3 times as high as that exhibited by the conventional polishing solution which does not contain 2-quinoline carboxylic acid, as apparent from the comparison between FIG. 3 with no addition of 2-quinoline carboxylic acid (conventional polishing solution) and FIG. 4 with no addition of hydrogen peroxide (present invention). To be more specific, the copper polishing rate with no addition of 2-quinoline carboxylic acid shown in FIG. 3 was only about 15 nm/min in contrast to about 51 nm/min achieved by the polishing solution of the present invention, with no addition of hydrogen peroxide, shown in FIG. 4.

It should be noted that the polishing solution of the present invention does not dissolve at all copper or a copper alloy when a copper or copper alloy film is immersed therein, and permits polishing a copper or copper alloy film at a practical polishing rate, which is at least 3 times as high as that achieved by the conventional polishing solution containing polishing abrasive grains. It follows that the polishing solution of the present invention makes it possible to avoid the problem that the copper etching rate is changed by, for example, the timing of supplying a polishing solution in the step of the polishing treatment. In addition, the polishing treatment can be performed easily in the case of using the polishing solution of the present invention.

It is important to note that, where the polishing apparatus shown in FIG. 1 is used for polishing the copper film formed on the substrate surface, the copper film is polished only when the polishing pad is in contact with the copper film under a predetermined load. In other words, the polishing is stopped immediately after the polishing pad is moved away from the copper film, making it possible to prevent a so-called over-etching, i.e., the phenomenon that the copper film is further etched after completion of the polishing treatment.

In the polishing step of the copper film 12 having projections and recesses as shown in FIG. 5C, etching does not proceed from the side surface. Since the etching proceeds from only the upper surface of the projection in contact with the polishing pad, it is highly effective to employ the technical idea of the present invention in the etch-back technique described herein later. Further, the surface of the copper film after the polishing treatment is brought into contact with the polishing solution, with the result that a layer of the particular copper complex compound is formed on the copper film surface. However, since the copper complex compound layer is as thin as only 20 nm, the copper film can be prevented from being unduly thinned in the step of removing the copper complex compound layer to expose the surface of the pure copper to the outside.

The polishing solution of the present invention may further contain an alkalizing agent such as choline so as to adjust the pH value and, thus, to control the polishing rate of the copper or copper alloy film. FIG. 6 is a graph showing how the polishing rate of a copper film formed on a substrate is affected by the pH value of the polishing solution, covering the case where the copper film was subjected to a polishing treatment using a polishing solution containing 0.3% by weight of 2-quinoline carboxylic acid, 1.3% by weight of γ-alumina grains, 4.0% by weight of colloidal silica grains, and 16.7% by weight of hydrogen peroxide. Choline was added to the polishing solution to control the pH value of the solution within a range of between 4 and 9.5. FIG. 6 clearly shows that the polishing rate of the copper film is decreased with increase in the pH value. Particularly, the polishing rate is markedly lowered, if the pH value exceeds 8.

The polishing solution of the present invention may further contain nonionic, amphoteric, anionic or cationic surfactant so as to improve the polishing selectivity between the copper or copper alloy film and the insulating film such as a $SiO_2$ film. FIG. 7 is a graph showing how the polishing rate of a copper film, a silicon nitride film formed by plasma CVD (P-SiN film), or a $SiO_2$ film formed on a substrate is affected by the concentration of sodium dodecyl sulfate (SDS), which is an anionic surfactant, covering the case where the copper film or the like was subjected to a polishing treatment using a polishing solution containing 0.3% by weight of 2-quinoline carboxylic acid, 1.3% by weight of γ-alumina grains, 4.0% by weight of colloidal silica grains, 16.7% by weight of hydrogen peroxide, and varied amount of SDS. Curve A in FIG. 7 denotes the change in the polishing rate of the copper film, with curves B and C denoting the changes in the polishing rates of the P-SiN film and the $SiO_2$ film, respectively. FIG. 7 shows that the polishing rate of the copper film is increased with increase in the SDS concentration (curve A). On the other hand, the polishing rates of the P-SiN film and the $SiO_2$ film are decreased with increase in the SDS concentration. It is seen that the polishing rate of each of the P-SiN film and the $SiO_2$ film is lowered to substantially zero, when the SDS concentration is increased to reach 10 mmol/liter. It follows that the polishing selectivity between the copper film and the insulating film such as the P-SiN film or $SiO_2$ film can be improved by controlling the amount of SDS added to the polishing solution. The polishing selectivity can be improved by the addition of not only the anionic surfactant of SDS but also the amphoteric, cationic and nonionic surfactants, as shown in FIG. 8.

As described above, 2-quinoline carboxylic acid contained in the polishing solution of the present invention reacts with copper to form a copper complex compound which is unlikely to be dissolved in water and has a mechanical strength lower than that of copper. In addition, other water-soluble organic acids such as 2-pyridine carboxylic acid, 2,6-pyridine carboxylic acid, and quinone can also be used satisfactorily in place of 2-quinoline carboxylic acid. In the case of using any of these water-soluble organic acids, a copper or copper alloy film is not dissolved at all when immersed in the polishing solution containing the particular organic acid, and the copper or copper alloy film can be polished at a practical polishing rate.

The present invention also provides a method for manufacturing a semiconductor device, comprising the steps of:

forming at least one member selected from the group consisting of a trench and an opening, the trench and opening conforming in shape with a wiring layer, in an insulating film formed on a semiconductor substrate;

depositing a wiring material selected from the group consisting of elemental copper and a copper alloy on the insulating film having at least one of the trench and opening formed therein; and polishing the deposited wiring material film until a surface of the insulating film is exposed by using a polishing solution comprising a water-soluble organic acid capable of reaction with copper to form a copper complex compound which is unlikely to be dissolved in water and has a mechanical strength lower than that of copper, polishing abrasive grains and water, thereby forming a buried wiring layer in the insulating film such that surfaces of the wiring layer and the insulating film are level with each other.

The insulating film formed on the semiconductor substrate includes, for example, a silicon oxide film, a boron-added glass film (BPSG film), and a phosphorus-added glass film (PSG film). The insulating film may be covered with a polishing stopper film made of, for example, silicon nitride, carbon, alumina, boron nitride, or diamond.

The copper alloy used in the present invention as a wiring material includes, for example, a Cu—Si alloy, a Cu—Al alloy, a Cu—Si—Al alloy and a Cu—Ag alloy. The wiring material film made of copper or copper alloy can be deposited by means of, for example, sputtering, vapor deposition, or vacuum vapor deposition.

The organic acid content of the polishing solution should desirably fall within the range described previously in conjunction with the copper-based metal polishing solution of the present invention. The polishing abrasive grains contained in the polishing solution include, for example, alumina grains, silica grains, cerium oxide grains and zirconia grains. In preparing the polishing abrasive grains, it is desirable to use as a base material alumina grains having a hardness adapted for the polishing. To be more specific, it is desirable to use alumina grains alone or a mixture of alumina grains and silica grains such as colloidal silica grains for preparing the polishing abrasive grains.

The polishing abrasive grains should desirably be spherical or substantially spherical and should desirably have an average grain diameter of 0.02 to 0.1 μm. Where the polishing solution contains polishing abrasive grains defined in the present invention, it is possible to suppress damage done to the surface of the copper or copper alloy film. It is particularly desirable to use γ-alumina grains as the polishing abrasive grains because spherical γ-alumina grains can be manufactured without difficulty. Further, the polishing abrasive grains should be contained in the polishing solution in an amount of 1 to 20% by weight, preferably, 2 to 7% by weight.

It is also possible for the polishing solution to contain a promotor for forming a copper complex compound. Oxidizing agents such as hydrogen peroxide ($H_2O_2$), and sodium hypochlorite (NaClO) can be used as such a promotor. The amount of the oxidizing agent should be at least 10 times as much by weight as the organic acid contained in the polishing solution. Where the amount of the oxidizing agent is less than 10 times as much by weight as the amount of the organic acid, the oxidizing agent fails to promote sufficiently the formation of the copper complex compound on the surface of the copper or copper alloy film. Preferably, the oxidizing agent should be used in an amount at least 30 times, and more preferably, at least 50 times as much by weight as the amount of the organic acid contained in the polishing solution.

It is also possible for the polishing solution to contain a pH value-controlling agent such as alkalizing agents including, for example, potassium hydroxide and trimethyl ammonium hydroxide.

Further, it is also possible for the polishing solution used in the method of the present invention for manufacturing a semiconductor device to contain nonionic, amphoteric, anionic and/or cationic surfactants. The nonionic surfactants used in the present invention include, for example, polyethylene glycol phenyl ether and ethylene glycol fatty acid ester. The amphoteric surfactants used in the present invention include, for example, imidazolibetaine. The anionic surfactants used in the present invention include, for example, sodium dodecyl sulfate. Further, the cationic surfactants used in the present invention includes, for example, stearin trimethyl ammonium chloride. These surfactants can be used singly or in the form of a mixture of a plurality of different surfactants.

The polishing apparatus shown in FIG. 1 can be used for applying a polishing treatment to the semiconductor substrate having a wiring material film deposited thereon. In performing a polishing treatment by using the polishing apparatus shown in FIG. 1, the load applied to the polishing pad through the semiconductor substrate held by a substrate holder is determined appropriately in view of the composition of the polishing solution used. Where the polishing solution consists of, for example, 2-quinoline carboxylic acid, polishing abrasive grains and water, it is desirable for the load to fall within a range of between 50 g/cm$^2$ and 1000 g/cm$^2$.

The method of the present invention for manufacturing a semiconductor device may also comprise the step of forming a barrier layer in the insulating film having at least one member selected from the group consisting of a trench and an opening formed therein before the step of depositing a wiring material film. In the case of forming such a barrier layer, it is possible to form a buried wiring layer surrounded by the barrier layer in at least one of the trench and the opening by the subsequent step of depositing a wiring material film such as a copper film, followed by etch back. As a result, diffusion of copper, i.e., the wiring material, into the insulating film can be inhibited by the barrier layer, making it possible to prevent the semiconductor substrate from being contaminated by copper. The barrier layer should be formed of, for example, TiN, Ti, Nb, W or CuTa alloy, and should desirably have a thickness falling within a range of between 15 nm and 50 nm.

To reiterate, the method of the present invention for manufacturing a semiconductor substrate comprises the steps of forming at least one member selected from the group consisting of a trench and an opening, the trench and opening conforming in shape with a wiring layer, in an insulating film formed on a semiconductor substrate, depositing a wiring material selected from the group consisting of elemental copper and a copper alloy on the insulating film having at least one of the trench and opening formed therein, and polishing the deposited wiring material film until a surface of the insulating film is exposed by using a polishing solution comprising a water-soluble organic acid capable of reaction with copper to form a copper complex compound which is unlikely to be dissolved in water and has a mechanical strength lower than that of copper, polishing abrasive grains and water, thereby forming a buried wiring layer in the insulating film such that surfaces of the wiring layer and the insulating film are level with each other. Of course, the wiring layer is formed within the trench or opening formed in the first step. Also, the polishing apparatus as shown in FIG. 1 is used for applying the polishing treatment to the deposited wiring material film. As already described, the polishing solution used in the present invention does not dissolve at all a copper or copper alloy film when the film is immersed in the polishing solution. In addition, the polishing solution permits polishing the copper or copper alloy film at a practical polishing rate, i.e., at least 3 times as high as the polishing rate achieved by the conventional polishing solution containing polishing abrasive grains alone. Particularly, where the polishing solution contains a promotor for forming a copper complex compound such as an oxidizing agent, the copper or copper alloy film can be polished at a polishing rate at least 5 times as high as the polishing rate achieved by the conventional polishing solution containing polishing abrasive grains alone. As a result, the upper surface alone of the wiring material film (e.g., a copper film) can be polished so as to achieve a so-called etch-back. It follows that it is possible to form a buried wiring layer made of copper or a copper alloy in at least one of a trench and an opening formed in the insulating film such that the upper surface of the buried wiring layer is flush with the surface of the insulating film. What should also be noted is that the resultant wiring layer is prevented from being etched when the wiring layer is brought into contact with the polishing solution after the etch-back step, because the polishing solution used in the present invention does not dissolve at all copper or a copper alloy, as already described. It follows that the method of the present invention makes it possible to manufacture a semiconductor device comprising a buried wiring layer of a high precision having a flat surface.

The surface of the buried wiring layer formed in the insulating film is brought into contact with the polishing solution, resulting in formation of a copper complex compound layer. However, since the copper complex compound layer thus formed is as thin as only 20 nm, the buried wiring layer is prevented from being unduly thinned in the step of exposing the pure copper surface by removing the copper complex compound layer.

Further, the polishing solution used in the present invention contains spherical or substantially spherical polishing abrasive grains, with the result that the wiring material film is prevented from being cracked or damaged in the etch-back step. It follows that it is possible to form a buried wiring layer of a high reliability in the insulating film. It should also be noted that, if the insulating film is covered in advance with a polishing stopper film made of, for example, silicon nitride, carbon, alumina, boron nitride or diamond, the insulating film can be prevented from being polished in the etch back step of the wiring material film. As a result, thinning of the insulating film can be suppressed, making it possible to manufacture a semiconductor device having a high breakdown voltage.

Further, where the polishing solution contains nonionic, amphoteric, anionic and/or cationic surfactants, the polishing selectivity between the wiring material film made of copper or a copper alloy and the insulating film made of, for example, SiO$_2$ can be improved in the etch back step, making it possible to prevent the insulating film from being thinned. It follows that the resultant semiconductor device is enabled to exhibit a high breakdown voltage. In addition, where the polishing solution contains such a surfactant, the contaminants remaining on the insulating film such fine wiring material and organic materials can be removed easily in a washing step after the etch back step, making it possible to manufacture a semiconductor device having a clean surface, i.e., an insulating film having organic materials and residual wiring material removed from the surface thereof.

Let us describe preferred Examples of the present invention with reference to the accompanying drawings.

EXAMPLE 1

A SiO$_2$ film 22 having a thickness of, for example, 1000 nm was formed as an interlayer insulating film by a CVD method on the surface of a silicon substrate 21 having diffusion layers (not shown) such as source and drain layers formed in a surface region thereof, as shown in FIG. 9A. Then, a plurality of trenches 23 each having a depth of 500 nm and conforming in shape with a wiring layer were formed in the SiO$_2$ film 22 by a photoetching technique. After formation of these trenches 23, a barrier layer 24 made of TiN and having a thickness of 15 nm and a copper film 25 having a thickness of 600 nm were formed successively in this order by a sputtering technique on the surface of the SiO$_2$ film 22 including the trenches 23, as shown in FIG. 9B.

The substrate 21 having the barrier layer 24 and the copper film 25 formed thereon as shown in FIG. 9B was held by the substrate holder 5 included in the polishing apparatus shown in FIG. 1 such that the copper film 25 was in contact with the polishing pad 2, i.e., SUBA 800 which is a trade name of a polishing pad manufactured by Rhodel Nitter Inc, included in the polishing apparatus. Under this condition, a load of 300 g/cm² was applied via the supporting shaft 4 of the substrate holder 5 to the substrate in contact with the polishing pad 2 disposed on the turntable 1, and the turntable 1 and the substrate holder 5 were rotated in opposite directions each at a speed of 100 rpm. During the rotation, a polishing solution consisting of 0.3 wt % by weight of 2-quinoline carboxylic acid, 1.4 wt % by weight of γ-alumina grains having an average grain diameter of 30 nm, 4.1 wt % by weight of colloidal silica grains, and the balance of pure water was supplied through the supply pipe 3 onto the polishing pad 2 at a rate of 12.5 ml/min so as to polish the copper film 25 and the barrier layer 24 deposited on the semiconductor substrate 21 until the surface of the $SiO_2$ film 22 was exposed to the outside. In this polishing step, etching of the copper film 25 was not recognized at all when the polishing solution was brought into contact with the copper film. Also, the polishing rate achieved by the polishing pad 2 was found to be about 51 nm/min. As a result, the upper surfaces of the projections of the copper film 25 as shown in FIG. 9B, which were in a mechanical contact with the polishing pad 2, were preferentially polished first and, then, the exposed barrier layer 24 was subsequently polished. In other words, a so-called etch back was achieved. Since the polishing was performed until the upper surfaces of the projected portions of the $SiO_2$ 22 were exposed to the outside, formed was a buried copper wiring layer 26 within the trench 23, as shown in FIG. 9C. It is seen that the buried copper wiring layer 26 was surrounded by the barrier layer 24, and that the upper surface of the buried copper wiring layer 26 was flush with the upper surface of the $SiO_2$ film 22.

After the polishing treatment, the load applied to the polishing pad 2 via the substrate holder 5 was released. Also, rotations of the turntable 1 and the holder 5 were stopped. As a result, the copper wiring layer 26 was brought into contact with the polishing solution. However, the copper wiring layer 26 was found not to be etched at all.

EXAMPLE 2

A $SiO_2$ film having a thickness of, for example, 1000 nm was formed as an interlayer insulating film by a CVD method on the surface of a silicon substrate having diffusion layers (not shown) such as source and drain layers formed in a surface region thereof. Then, a plurality of trenches each having a depth of 500 nm and conforming in shape with a wiring layer were formed in the $SiO_2$ film by a photoetching technique. After formation of these trenches, a barrier layer made of TiN and having a thickness of 15 nm and a copper film having a thickness of 600 nm were formed successively in this order by a sputtering technique on the surface of the $SiO_2$ film including the trenches.

The substrate having the barrier layer and the copper film formed thereon was held by the substrate holder 5 included in the polishing apparatus shown in FIG. 1 such that the copper film was in contact with the polishing pad 2, i.e., SUBA 800, included in the polishing apparatus. Under this condition, a load of 300 g/cm² was applied via the supporting shaft 4 of the substrate holder 5 to the substrate in contact with the polishing pad 2 disposed on the turntable 1, and the turntable 1 and the substrate holder 5 were rotated in opposite directions each at a speed of 100 rpm. During the rotation, a polishing solution consisting of 0.3% by weight of 2-quinoline carboxylic acid, 16.7% by weight of hydrogen peroxide, 1.3% by weight of γ-alumina grains having an average grain diameter of 30 nm, 4.0% by weight of colloidal silica grains, and the balance of pure water was supplied through the supply pipe 3 onto the polishing pad 2 at a rate of 12.5 ml/min so as to polish the copper film and the barrier layer deposited on the silicon substrate until the surface of the $SiO_2$ film was exposed to the outside. It should be noted that the amount of hydrogen peroxide used was about 56 times as much by weight as the amount of 2-quinoline carboxylic acid used. In this polishing step, etching of the copper film was not recognized at all when the polishing solution was brought into contact with the copper film. Also, the polishing rate achieved by the polishing pad was found to be about 85 nm/min. As a result, the upper surfaces of the projections of the copper film, which were in a mechanical contact with the polishing pad, were preferentially polished first and, then, the exposed barrier layer was subsequently polished. In other words, a so-called etch back was achieved. Since the polishing was performed until the upper surfaces of the projected portions of the $SiO_2$ were exposed to the outside, formed was a buried copper wiring layer within the trench. It should be noted that the buried copper wiring layer was surrounded by the barrier layer, and that the upper surface of the buried copper wiring layer was flush with the upper surface of the $SiO_2$ film.

After the polishing treatment, the load applied to the polishing pad 2 via the substrate holder 5 was released. Also, rotations of the turntable 1 and the holder 5 were stopped. As a result, the copper wiring layer was brought into contact with the polishing solution. However, the copper wiring layer 26 was found not to be etched at all.

EXAMPLE 3

A $SiO_2$ film having a thickness of, for example, 1000 nm was formed as an interlayer insulating film by a CVD method on the surface of a silicon substrate having diffusion layers (not shown) such as source and drain layers formed in a surface region thereof. Then, a plurality of trenches each having a depth of 500 nm and conforming in shape with a wiring layer were formed in the $SiO_2$ film by a photoetching technique. After formation of these trenches, a barrier layer made of TiN and having a thickness of 15 nm and a copper film having a thickness of 600 nm were formed successively in this order by a sputtering technique on the surface of the $SiO_2$ film including the trenches.

The substrate having the barrier layer and the copper film formed thereon was held by the substrate holder 5 included in the polishing apparatus shown in FIG. 1 such that the copper film was in contact with the polishing pad 2, i.e., SUBA 800 referred to previously, included in the polishing apparatus. Under this condition, a load of 300 g/cm² was applied via the supporting shaft 4 of the substrate holder 5 to the substrate in contact with the polishing pad 2 disposed on the turntable 1, and the turntable 1 and the substrate holder 5 were rotated in opposite directions each at a speed of 100 rpm. During the rotation, a polishing solution consisting of 0.3% by weight of 2-quinoline carboxylic acid, 16.7% by weight of hydrogen peroxide, 1.3% by weight of γ-alumina grains having an average grain diameter of 30 nm, 4.0% by weight of colloidal silica grains, 10 mmol/liter of sodium dodecyl sulfate, which is an anionic surfactant, and the balance of pure water was supplied through the supply pipe 3 onto the polishing pad 2 at a rate of 12.5 ml/min so as to polish the copper film and the barrier layer deposited on the silicon substrate until the surface of the $SiO_2$ film was exposed to the outside. It should be noted that the amount of hydrogen peroxide used was about 56 times as much by weight as the amount of 2-quinoline carboxylic acid used. In this polishing step, etching of the copper film was not recognized at all when the polishing solution was brought into contact with the copper film. Also, the polishing rate achieved by the polishing pad was found to be about 85 nm/min. As a result, the upper surfaces of the projections of the copper film, which were in a mechanical contact with the polishing pad, were preferentially polished first and, then, the exposed barrier layer was subsequently polished. In other words, a so-called etch back was achieved. Since the polishing was performed until the upper surfaces of the projected portions of the $SiO_2$ were exposed to the outside, formed was a buried copper wiring layer within the trench. It should be noted that the buried copper wiring layer was surrounded by the barrier layer, and that the upper surface of the buried copper wiring layer was flush with the upper surface of the $SiO_2$ film.

As already described in conjunction with FIG. 7, an etching solution containing a surfactant exhibits a high polishing selectivity. As a matter of fact, the $SiO_2$ film formed as an interlayer insulating film was prevented from being thinned in this Example because the polishing solution used contained a surfactant as described above.

After the polishing treatment, the load applied to the polishing pad 2 via the substrate holder 5 was released. Also, rotations of the turntable 1 and the holder 5 were stopped. As a result, the copper wiring layer was brought into contact with the polishing solution. However, the copper wiring layer was found not to be etched at all.

Further, an ultrasonic wave washing was applied by using pure water to the silicon substrate having the buried wiring layer formed therein. As a result, the residual copper particles, copper complex compound particles and organic material such as 2-quinoline carboxylic acid were removed from the substrate surface including the surface of the $SiO_2$ film (interlayer insulating film) so as to clean the surface of the $SiO_2$ film, etc.

As described above, a buried copper wiring layer having a thickness equal to the depth of the trench formed in the interlayer insulating film was formed in the interlayer insulating film in this Example. What should be noted is that the upper surface of the buried copper wiring layer was flush with the surface of the interlayer insulating film so as to make flat the surface of the silicon substrate after formation of the wiring layer. Further, the polishing solution used in the etch back step for forming the buried copper wiring layer contained a surfactant. In addition, the silicon substrate after formation of the buried copper wiring layer was subjected to washing with an ultrasonic wave using a pure water. As a result, the surfactant contained in the polishing solution permitted the surface of the interlayer insulating film to be cleaned without difficulty so as to prepare a semiconductor device of a high reliability comprising a buried copper wiring layer of a low resistivity inherent in copper.

EXAMPLE 4

A $SiO_2$ film having a thickness of, for example, 1000 nm was formed as an interlayer insulating film by a CVD method on the surface of a silicon substrate having diffusion layers (not shown) such as source and drain layers formed in a surface region thereof. Then, a plurality of trenches each having a depth of 500 nm and conforming in shape with a wiring layer were formed in the $SiO_2$ film by a photoetching technique. After formation of these trenches, a barrier layer made of TiN and having a thickness of 15 nm and a copper film having a thickness of 600 nm were formed successively in this order by a sputtering technique on the surface of the $SiO_2$ film including the trenches.

The substrate having the barrier layer and the copper film formed thereon was held by the substrate holder 5 included in the polishing apparatus shown in FIG. 1 such that the copper film was in contact with the polishing pad 2, i.e., SUBA 800, included in the polishing apparatus. Under this condition, a load of 300 g/cm$^2$ was applied via the supporting shaft 4 of the substrate holder 5 to the substrate in contact with the polishing pad 2 disposed on the turntable 1, and the turntable 1 and the substrate holder 5 were rotated in opposite directions each at a speed of 100 rpm. During the rotation, a polishing solution consisting of 0.3% by weight of 2-quinoline carboxylic acid, 1.4% by weight of γ-alumina grains having an average grain diameter of 30 nm, 4.1% by weight of colloidal silica grains, and the balance of pure water was supplied through the supply pipe 3 onto the polishing pad 2 at a rate of 12.5 ml/min so as to polish the copper film and the barrier layer deposited on the silicon substrate until the surface of the $SiO_2$ film was exposed to the outside. In this polishing step, etching of the copper film was not recognized at all when the polishing solution was brought into contact with the copper film. Also, the polishing rate achieved by the polishing pad was found to be about 30 nm/min. As a result, the upper surfaces of the projections of the copper film, which were in a mechanical contact with the polishing pad, were preferentially polished first and, then, the exposed barrier layer was subsequently polished. In other words, a so-called etch back was achieved. Since the polishing was performed until the upper surfaces of the projected portions of the $SiO_2$ were exposed to the outside, formed was a buried copper wiring layer within the trench. It should be noted that the buried copper wiring layer was surrounded by the barrier layer, and that the upper surface of the buried copper wiring layer was flush with the upper surface of the $SiO_2$ film.

After the polishing treatment, the load applied to the polishing pad 2 via the substrate holder 5 was released. Also, rotations of the turntable 1 and the holder 5 were stopped. As a result, the copper wiring layer 26 was brought into contact with the polishing solution. However, the copper wiring layer 26 was found not to be etched at all.

EXAMPLE 5

A $SiO_2$ film 22 having a thickness of, for example, 800 nm and a $Si_3N_4$ film 27 having a thickness of 200 nm and acting as a polishing stopper film were formed in this order, said $SiO_2$ film 22 and $Si_3N_4$ film 27 collectively forming an interlayer insulating film, by a CVD method on the surface of a silicon substrate 21 having diffusion layers (not shown) such as source and drain layers formed in a surface region thereof, as shown in FIG. 10A. Then, a plurality of trenches 23 each having a depth of 500 nm and conforming in shape with a wiring layer were formed to extend through the $Si_3N_4$ film 27 to reach a middle region of the $SiO_2$ film 22 by a photoetching technique. After formation of these trenches 23, a barrier layer 24 made of TiN and having a thickness of 15 nm and a copper film 25 having a thickness of 600 nm were formed successively in this order by a sputtering technique on the surface of the $Si_3N_4$ film 27 including the trenches 23, as shown in FIG. 10B.

The substrate having the barrier layer 24 and the copper film 25 formed thereon as shown in FIG. 10B was held by the substrate holder 5 included in the polishing apparatus shown in FIG. 1 such that the copper film 25 was in contact with the polishing pad 2, i.e., SUBA 800 referred to previously, included in the polishing apparatus. Under this condition, a load of 300 g/cm$^2$ was applied via the supporting shaft 4 of the substrate holder 5 to the substrate in contact with the polishing pad 2 disposed on the turntable 1, and the turntable 1 and the substrate holder 5 were rotated in opposite directions each at a speed of 100 rpm. During the rotation, a polishing solution consisting of 0.3% by weight of 2-quinoline carboxylic acid, 16.7% by weight of hydrogen peroxide, 1.3% by weight of γ-alumina grains having an average grain diameter of 30 nm, 4.0% by weight of colloidal silica grains, and the balance of pure water was supplied through the supply pipe 3 onto the polishing pad 2 at a rate of 12.5 ml/min so as to polish the copper film 25 and the barrier layer 24 deposited on the semiconductor substrate 21 until the surface of the $Si_3N_4$ film 27 was exposed to the outside. It should be noted that the amount of hydrogen peroxide used was about 56 times as much by weight as the amount of 2-quinoline carboxylic acid used. In this polishing step, etching of the copper film 25 was not recognized at all when the polishing solution was brought into contact with the copper film. Also, the polishing rate achieved by the polishing pad 2 was found to be about 100 nm/min. As a result, the upper surfaces of the projections of the copper film 25 as shown in FIG. 10B, which were in a mechanical contact with the polishing pad 2, were preferentially polished first and, then, the exposed barrier layer 24 was subsequently polished. In other words, a so-called etch back was achieved. Since the polishing was performed until the upper surfaces of the projected portions of the $Si_3N_4$ 27 were exposed to the outside, formed was a buried copper wiring layer 26 within the trench 23, as shown in FIG. 10C. It is seen that the buried copper wiring layer 26 was surrounded by the barrier layer 24, and that the upper surface of the buried copper wiring layer 26 was flush with the upper surface of the $Si_3N_4$ film 27.

After the polishing treatment, the load applied to the polishing pad 2 via the substrate holder 5 was released. Also, rotations of the turntable 1 and the holder 5 were stopped. As a result, the copper wiring layer 26 was brought into contact with the polishing solution. However, the copper wiring layer 26 was found not to be etched at all.

What should also be noted is that the $Si_3N_4$ film 27 acting as a polishing stopper film was included in the interlayer insulating film in this Example. As a result, it was possible to suppress effectively the thinning of the interlayer insulating film in the etch back step, leading to production of a semiconductor device comprising an interlayer insulating film exhibiting a high breakdown voltage.

EXAMPLE 6

A $SiO_2$ film 33 having a thickness of, for example, 1000 nm and acting as a first interlayer insulating film was formed by a CVD method on the surface of a p-type silicon substrate 32 having an $n^+$-type diffusion layer 31 formed in a surface region thereof, as shown in FIG. 11A. Then, an opening, i.e., a via hall 34 was formed through the $SiO_2$ film 33 to expose the $^+$-type diffusion layer 31 by a photoetching technique. After formation of the via hall 34, a barrier layer 35 made of TiN and having a thickness of 20 nm and a copper film 36 having a thickness of 1100 nm were formed successively in this order by a sputtering technique on the surface of the $SiO_2$ film 33 including the via hall 34, as shown in FIG. 11B.

The substrate having the barrier layer 35 and the copper film 36 formed thereon as shown in FIG. 11B was held by the substrate holder 5 included in the polishing apparatus shown in FIG. 1 such that the copper film 36 was in contact with the polishing pad 2, i.e., SUBA 800 referred to previously, included in the polishing apparatus. Under this condition, a load of 300 g/cm² was applied via the supporting shaft 4 of the substrate holder 5 to the substrate in contact with the polishing pad 2 disposed on the turntable 1, and the turntable 1 and the substrate holder 5 were rotated in opposite directions each at a speed of 100 rpm. During the rotation, a polishing solution consisting of 0.3% by weight of 2-quinoline carboxylic acid, 16.7% by weight of hydrogen peroxide, 1.3% by weight of γ-alumina grains having an average grain diameter of 30 nm, 4.0% by weight of colloidal silica grains, 10 mmol/liter of sodium dodecyl sulfate used as an anionic surfactant, and the balance of pure water was supplied through the supply pipe 3 onto the polishing pad 2 at a rate of 12.5 ml/min so as to polish the copper film 36 and the barrier layer 35 deposited on the silicon substrate 32 until the surface of the $SiO_2$ film 33 was exposed to the outside. It should be noted that the amount of hydrogen peroxide used was about 56 times as much by weight as the amount of 2-quinoline carboxylic acid used. In this polishing step, etching of the copper film 36 was not recognized at all when the polishing solution was brought into contact with the copper film. Also, the polishing rate achieved by the polishing pad 2 was found to be about 85 nm/min. As a result, the upper surfaces of the projections of the copper film 36 as shown in FIG. 11B, which were in a mechanical contact with the polishing pad 2, were preferentially polished first and, then, the exposed barrier layer 35 was subsequently polished. In other words, a so-called etch back was achieved. Since the polishing was performed until the upper surfaces of the projected portions of the $SiO_2$ 33 were exposed to the outside, formed was a copper via fill 37 within the via hall 34, as shown in FIG. 11C. It is seen that the copper via fill 37 was surrounded by the barrier layer 35, and that the upper surface of the copper via fall 37 was flush with the upper surface of the $SiO_2$ film 33.

After the polishing treatment, the load applied to the polishing pad 2 via the substrate holder 5 was released. Also, rotations of the turntable 1 and the holder 5 were stopped. As a result, the copper via fall 37 was brought into contact with the polishing solution. However, the copper via fall 37 was found not to be etched at all. Further, the silicon substrate having the copper via fall 37 formed therein was subjected to an ultrasonic wave washing by using a pure water so as to clean the surface of the $SiO_2$ film 33.

Figure 11D:
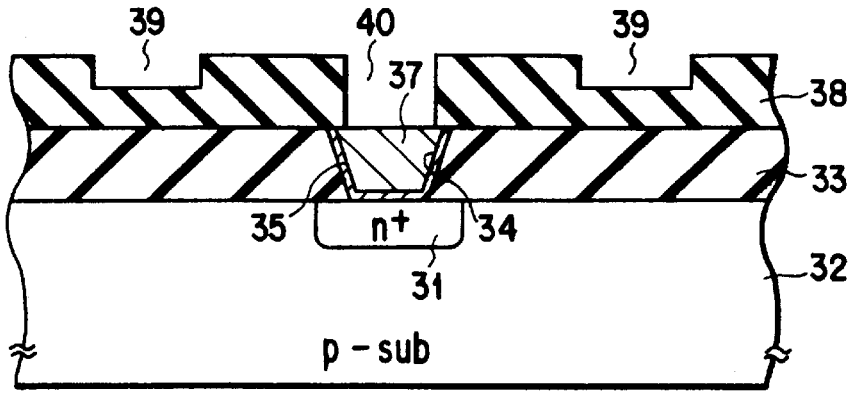

In the next step, a $Si_3N_4$ film 38 having a thickness of, for example, 800 nm and acting as a second interlayer insulating film was formed by a CVD method on the surface of the $SiO_2$ film 33 including the copper via fall 37, as shown in FIG. 11D. Then, a plurality of trenches 39 each having a depth of 400 nm and corresponding in shape to a wiring layer were formed in the $Si_3N_4$ film 38 by a photoetching technique such that these trenches 39 extended in a vertical direction to reach a middle part of the $Si_3N_4$ film 38, followed by forming a through-hole 40 by a photoetching technique in one of these grooves to expose the copper via fall 37 formed previously. Further, a copper film 41 having a thickness of 900 nm was formed by a sputtering technique on the surface of the $Si_3N_4$ film 38 including the trenches 39 and the through-hole 40, as shown in FIG. 11E.

Figure 11E:
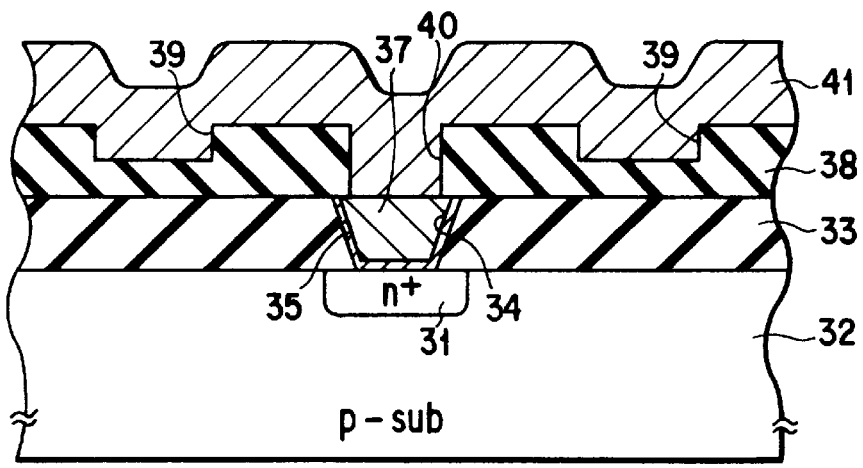

The silicon substrate having the copper film 41 formed thereon as shown in FIG. 11E was held by the substrate holder 5 included in the polishing apparatus shown in FIG. 1 such that the copper film 41 was in contact with the polishing pad 2, i.e., SUBA 800, included in the polishing apparatus. Under this condition, a load of 300 g/cm² was applied via the supporting shaft 4 of the substrate holder 5 to the substrate in contact with the polishing pad 2 disposed on the turntable 1, and the turntable 1 and the substrate holder 5 were rotated in opposite directions each at a speed of 100 rpm. During the rotation, a polishing solution of the composition described previously was supplied through the supply pipe 3 onto the polishing pad 2 at a rate of 12.5 ml/min so as to polish the copper film 41 deposited on the silicon substrate 32 until the surface of the $Si_3N_4$ film 38 was exposed to the outside.

Figure 11F:
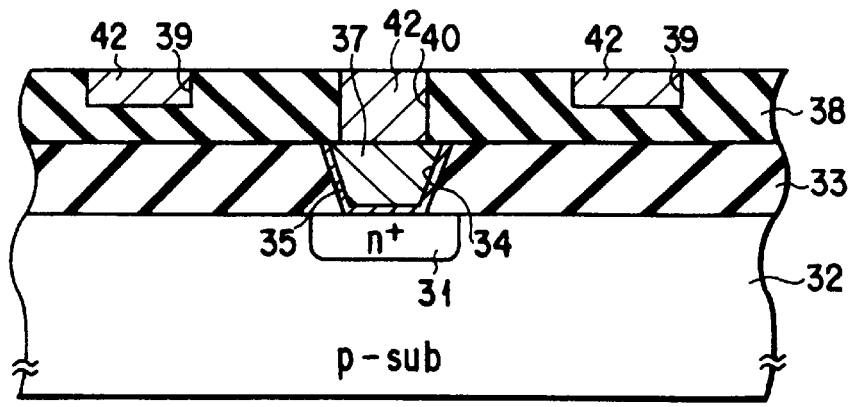

It should be noted that the upper surfaces of the projections of the copper film 41 as shown in FIG. 1E, which were in a mechanical contact with the polishing pad 2, were preferentially polished to achieve a so-called etch back. Since the polishing was performed until the upper surfaces of the projected portions of the $Si_3N_4$ film 38 were exposed to the outside, formed was a buried copper wiring layer 42 within each of the trenches 39 and the through-hole 40, as shown in FIG. 11F. Naturally, the copper wiring layer 42 thus formed within the through-hole 40 was in direct contact with the copper via fall 37 formed previously. It is seen that the upper surface of the buried copper wiring layer 42 was flush with the upper surface of the $Si_3N_4$ film 38.

After the polishing treatment, the load applied to the polishing pad 2 via the substrate holder 5 was released. Also, rotations of the turntable 1 and the holder 5 were stopped. As a result, the buried copper wiring layer 42 was brought into contact with the polishing solution. However, the copper wiring layer 42 was found not to be etched at all.

To reiterate, a multi-layer wiring structure comprising first and second interlayer insulating films 33, 39, the copper via fall 37 and buried copper wiring layer 42 formed in these interlayer insulating films, respectively, is employed in the semiconductor device prepared in Example 6. As already described, the upper surface of the copper via fall 37 is flush with the upper surface of the first interlayer insulating film 33. Also, the upper surface of the copper wiring layer 42 is flush with the upper surface of the second interlayer insulating film 38. Naturally, the produced semiconductor device has a flat surface.

As described above in detail, the present invention provides a copper-based metal polishing solution which does not dissolve at all copper or a copper alloy when a copper or copper alloy film is immersed therein and which permits polishing the copper or copper alloy film at a practical rate in the polishing step.

The present invention also provides a method for manufacturing a semiconductor device, comprising the steps of forming at least one member selected from the group consisting of a trench and an opening in an insulating film formed on a surface of a semiconductor substrate, depositing a wiring material film consisting of copper or a copper alloy on the insulating film, and subjecting the deposited wiring material film to an etch back in a short time so as to form a buried wiring layer made of copper or a copper alloy. It is important to note that the upper surface of the buried wiring layer is made flush with the upper surface of the insulating film, with the result that the manufactured semiconductor device has a flat surface.

The present invention further provides a method for manufacturing a semiconductor device having a flat surface and exhibiting an excellent breakdown voltage. The method comprises the steps of forming at least one member selected from the group consisting of a trench and an opening in an insulating film formed on a surface of a semiconductor substrate, depositing a wiring material film consisting of copper or a copper alloy on the insulating film, and subjecting the deposited wiring material film to an etch back in a short time so as to form a buried wiring layer made of copper or a copper alloy. It is important to note that the upper surface of the buried wiring layer is made flush with the upper surface of the insulating film. In addition, the insulating film having the buried wiring layer formed therein is prevented from being thinned in the etch back step.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A method for manufacturing a semiconductor device, comprising the steps of:
   forming at least one member selected from the group consisting of a trench and an opening, said trench and opening conforming in shape with a wiring layer, in an insulating film formed on a semiconductor substrate;
   forming a wiring material selected from the group consisting of elemental copper and a copper alloy on said insulating film having at least one of said trench and opening formed therein; and
   polishing the formed wiring material film until a surface of the insulating film is exposed by using a liquid polishing composition comprising a water-soluble organic acid capable of reaction with copper to form a copper complex compound which is unlikely to be dissolved in water and has a mechanical strength lower than that of copper abrasive grains and water, thereby forming a buried wiring layer in the insulating film such that surfaces of the wiring layer and the insulating film are level with each other.

2. The method according to claim 1, wherein a barrier layer is formed on said insulating film before the step of forming at least one member selected from the group consisting of a trench and an opening.

3. The method according to claim 2, wherein said barrier layer is formed of a material selected from the group consisting of TiN, Ti, Nb, W and CuTa alloy.

4. The method according to claim 1, wherein said copper alloy is selected from the group consisting of a Cu—Si alloy, a Cu—Al alloy, a Cu—Si—Al alloy, and a Cu—Ag alloy.

5. The method according to claim 1, wherein said organic acid contained in said liquid polishing composition is 2-quinoline carboxylic acid.

6. The method according to claim 1, wherein said organic acid is contained in said liquid polishing composition in an amount of at least 0.1% by weight.

7. The method according to claim 1, wherein said organic acid is contained in said liquid polishing composition in an amount of 0.3 to 1.2% by weight.

8. The method according to claim 1, wherein said abrasive grains contained in said liquid polishing composition are formed of at least one material selected from the group consisting of silica, zirconia, cerium oxide and alumina.

9. The method according to claim 1, wherein said abrasive grains contained in said liquid polishing composition have an average grain diameter of 0.02 to 0.1 $\mu$m.

10. The method according to claim 1, wherein said abrasive grains are contained in said liquid polishing composition in an amount of 1 to 20% by weight.

11. The method according to claim 1, wherein said liquid polishing composition further comprises a promoter for forming a copper complex compound.

12. The method according to claim 11, wherein an oxidizing agent is used as said promotor for forming a copper complex compound.

13. The method according to claim 12, wherein said oxidizing agent is hydrogen peroxide.

14. The method according to claim 12, wherein said oxidizing agent is used in an amount at least 10 times as much by weight as the amount of said water-soluble organic acid contained in said liquid polishing composition.

15. The method according to claim 1, wherein said liquid polishing solution further comprises a surfactant.

16. The method according to claim 15, wherein said surfactant is an anionic surfactant.

17. The method according to claim 15, wherein said surfactant is added in an amount of at least 1 mol/liter.

18. The method according to claim 1, wherein said organic acid contained in said liquid polishing composition is 2-quinoline carboxylic acid, 2-pyridine carboxylic acid, 2,6-pyridine carboxylic acid or a quinone.

19. A method for manufacturing a semiconductor device with formed multilayer interconnection structure, comprising the steps of:
   forming a first opening corresponding to a first via fill in a first insulating film on a semiconductor substrate;
   forming a first wiring material film consisting of copper or a copper alloy on said first insulating film including said first opening:
   polishing said first wiring material film by using a first liquid polishing composition comprising a first water-soluble organic acid capable of reaction with copper to form a copper complex compound which is unlikely to be dissolved in water and has a mechanical strength lower than that of copper, abrasive grains and water, thereby forming said first via fill in said first opening;

forming a second insulating film on said first insulating film including said first wiring layer;

forming a second opening corresponding to a shape of a second via fill in said second insulating film;

forming a second wiring material film consisting of copper or a copper alloy of said second insulating film including said second opening; and polishing said second wiring material film by using a second liquid polishing composition having the same composition as said first liquid polishing composition, thereby forming a second via fill in said second opening.

20. The method according to claim 19, wherein said organic acid is 2-quinoline caboxylic acid.

21. The method according to claim 19, wherein said first liquid polishing composition and said second liquid polishing composition each further comprises a promoter for forming a copper complex compound.

22. The method according to claim 19, wherein said first liquid polishing composition and said second liquid polishing composition each further comprises a surfactant.

23. The method according to claim 19, wherein a barrier layer is coated on the base and lateral face of said first opening after said forming of said first opening and prior to said forming a first wiring material film.

24. The method according to claim 23, wherein said barrier layer is made of at least one material selected from the group consisting of TiN, Ti, Nb, W and a CuTa alloy.

25. The method according to claim 23, further comprising polishing said barrier layer except inside of said first opening after polishing said first wiring material film.

26. A method for manufacturing a semiconductor device with formed multilayer interconnection structure, comprising the steps of:

forming a first opening corresponding to a first via fill in a first insulating film on a semiconductor substrate;

forming a first wiring material film consisting of copper or a copper alloy on said first insulating film including said first opening:

polishing said first wiring material film by using a first liquid polishing composition comprising a first water-soluble organic acid capable of reaction with copper to form a copper complex compound which is unlikely to be dissolved in water and has a mechanical strength lower than that of copper, abrasive grains and water, thereby forming said first via fill in said first opening;

forming a second insulating film on said first insulating film including said first via fill;

forming a trench corresponding to a shape of a second wiring layer in said second insulating film;

forming a second opening reached to said first via fill at the base of said second opening in said second insulating film;

forming a second wiring material film consisting of copper or a copper alloy on said second insulating film including said trench and said second opening; and polishing said second wiring material film by using a second polishing composition having the same composition as said first liquid polishing composition, thereby forming said second wiring layer and said second via fill in said trench and said second opening.

27. The method according to claim 26, wherein said organic acid is 2-quinoline carboxylic acid.

28. The method according to claim 26, wherein said first liquid polishing composition and said second liquid polishing composition each further comprises a promoter for forming a copper complex compound.

29. The method according to claim 26, wherein said first liquid polishing composition and said second liquid polishing composition each further comprises a surfactant.

30. The method according to claim 26, wherein a diffusion layer is formed on said semiconductor substrate, and said first via fill is connected to said diffusion layer.

31. The method according to claim 26, wherein a barrier layer is coated on the base and lateral face of said first opening after said forming of said first opening and prior to forming said first wiring material film.

32. The method according to claim 31, wherein said barrier layer is made of at least one material selected from the group consisting of TiN, Ti, Nb, W and a CuTa alloy.

33. The method according to claim 31, further comprising polishing said barrier layer except inside of said first opening after polishing said first wiring material film.

* * * * *